United States Patent
Duez et al.

(10) Patent No.: US 8,731,507 B2
(45) Date of Patent: May 20, 2014

(54) FREQUENCY CONVERSION DEVICE FOR WIRELESS SYSTEMS

(71) Applicant: ST-Ericsson SA, Plan-les-Ouates (CH)

(72) Inventors: Frederic Duez, Brignoud (FR); Luc Garcia, Saint Paul de Varces (FR); Benoit Butaye, Meylan (FR); Jerome Lajoinie, Gieres (FR); Thierry Lapergue, Briand Fontaine (FR); Mathilde Sie, Bernin (FR)

(73) Assignee: ST-Ericsson SA, Plan-les-Ouates (CH)

( * ) Notice: Subject to any disclaimer, the term of this patent is extended or adjusted under 35 U.S.C. 154(b) by 0 days.

(21) Appl. No.: 13/786,637

(22) Filed: Mar. 6, 2013

(65) Prior Publication Data

US 2013/0196611 A1   Aug. 1, 2013

Related U.S. Application Data

(63) Continuation-in-part of application No. PCT/EP2011/072830, filed on Dec. 14, 2011.

(60) Provisional application No. 61/435,606, filed on Jan. 24, 2011.

(30) Foreign Application Priority Data

Dec. 15, 2010 (EP) .................................. 10306418

(51) Int. Cl.
*H04B 1/26* (2006.01)
(52) U.S. Cl.
USPC ......................................... 455/323; 455/313
(58) Field of Classification Search
USPC ............................... 455/313, 3, 23
See application file for complete search history.

(56) References Cited

U.S. PATENT DOCUMENTS

| 7,630,700 | B2 | 12/2009 | Väisänen |
| 7,756,504 | B2 | 7/2010 | Rafi et al. |

(Continued)

FOREIGN PATENT DOCUMENTS

| EP | 2156550 A1 | 2/2010 |
| EP | 2179504 A2 | 4/2010 |

(Continued)

OTHER PUBLICATIONS

Shrestha, R. et al., "A Polyphase Multipath Technique for Software-Defined Radio Transmitters", IEEE Journal of Solid-State Circuits, Dec. 1, 2006, pp. 2681-2692, vol. 41, Issue 12, IEEE Solid-State Circuits Society.

(Continued)

*Primary Examiner* — Creighton Smith
(74) *Attorney, Agent, or Firm* — Coats & Bennett, P.L.L.C.

(57) ABSTRACT

A frequency conversion device for transforming a frequency of an input signal, the device comprising: a signal generator for providing a plurality N of first signals at a first frequency, where N≥1, from an input signal having an in-phase component I and a quadrature signal component Q; an oscillator for generating N parallel oscillation signals, wherein the N oscillation signals are stepped in phase with respect to one another; a mixer comprising N mixing components, each mixing component being coupled to receive a respective one of the plurality of first signals and coupled to receive a respective oscillation signal for mixing the respective first signal with the corresponding oscillation signal to provide an output signal; and a common amplifier for receiving the N output signals from the N mixing components in N sequential phases for transmission.

23 Claims, 8 Drawing Sheets

(56) References Cited

U.S. PATENT DOCUMENTS

| | | | |
|---|---|---|---|
| 2005/0059376 A1 | 3/2005 | Davis | |
| 2008/0068312 A1 | 3/2008 | Kim | |
| 2010/0119022 A1 | 5/2010 | He et al. | |
| 2010/0120377 A1 | 5/2010 | He | |
| 2010/0240335 A1* | 9/2010 | Rafi et al. | 455/323 |
| 2010/0323643 A1* | 12/2010 | Ridgers | 455/118 |

FOREIGN PATENT DOCUMENTS

| | | | |
|---|---|---|---|
| WO | 2005091493 A1 | 9/2005 | |
| WO | 2008135954 A2 | 11/2008 | |
| WO | 2008139390 A1 | 11/2008 | |
| WO | 2009003101 A2 | 12/2008 | |
| WO | 2010089700 A1 | 8/2010 | |

OTHER PUBLICATIONS

Moseley, N. et al., "A Blind Interference Canceling Technique for Two-Stage Harmonic Rejection in Down-mixers", Proceedings of the 19th Annual Workshop on Circuits, Nov. 28, 2008, pp. 214-217, Technology Foundation STW, Veldhoven, NL.

Weldon, J., "A 1.75-GHz highly integrated narrow-band CMOS transmitter with harmonic-rejection mixers", IEEE Journal of Solid-State Circuits, Dec. 1, 2001, pp. 2003-2015, vol. 36, Issue 12, IEEE.

* cited by examiner

FREQUENCY CONVERSION DEVICE FOR WIRELESS SYSTEMS

This application is a continuation-in-part of PCT Application No. PCT/EP2011/072830 having an international filing date of 14 Dec. 2011, which claims priority to Provisional U.S. Patent Application 61/435,606 filed 24 Jan. 2011, and which also claims priority to European Patent Application EP10306418.4 filed 15 Dec. 2010, all of which are incorporated herein by reference.

FIELD

Embodiments of the present invention relate to a mixer device for frequency conversion in wireless systems. Particularly, but not exclusively some embodiments relate to an up-mixer device for converting from IF to RF, and in particular a voltage-mode up-mixer device.

BACKGROUND

In a typical wireless communication system, baseband voice or data signals are carried on a radio frequency (RF) carrier frequency. In order to transmit signals on a RF carrier frequency, a transmitter is provided with circuitry that places the baseband signal on the RF carrier signal. This process is commonly termed frequency up-conversion and the circuitry that performs the process of converting from an intermediate frequency (IF) to a radio frequency (RF) is commonly referred to as a frequency up-converter. Likewise, at the receiving end, the baseband signal is extracted from the incoming RF signal picked up by the receiving antenna. This process is commonly termed frequency down-conversion and the circuitry that performs this process is commonly referred to as a frequency down-converter.

Frequency up conversion in such systems is typically performed by a mixer which multiplies the baseband signal to be transmitted, or the received RF signal, with a local oscillator (LO) signal to produce a signal that has spectral energy distributed at sums and differences of the LO signal and the baseband signal or the RF signal. In an up-conversion mixer the desired output is the sum of the local oscillator frequency $f_{lo}$ and the baseband signal frequency $f_{lq}$ while in a down conversion mixer, the desired output is the difference between the local oscillator frequency $f_{lo}$ and the incoming signal frequency $f_{rf}$.

In some mixing applications the local oscillator may be a non-sinusoidal wave such as a square wave containing spectral energy located at a fundamental frequency and at harmonic frequencies of the fundamental frequency. This leads to harmonic mixing in the mixing whereby the mixing of such a LO signal with the baseband signals generates signals with spectral energy at $f_{lq}$ away from the harmonics of the LO signal as well as the desired signal.

Figure 4:
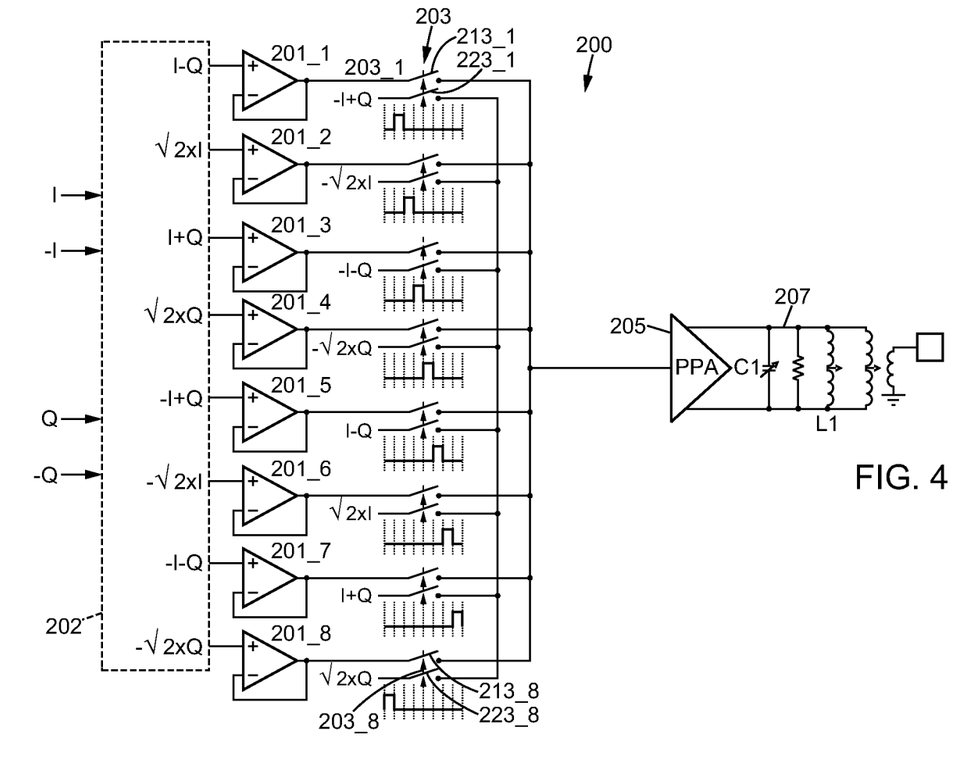
FIG. 4 is a block diagram of a mixing device according to another embodiment of the invention.
Figure 5:
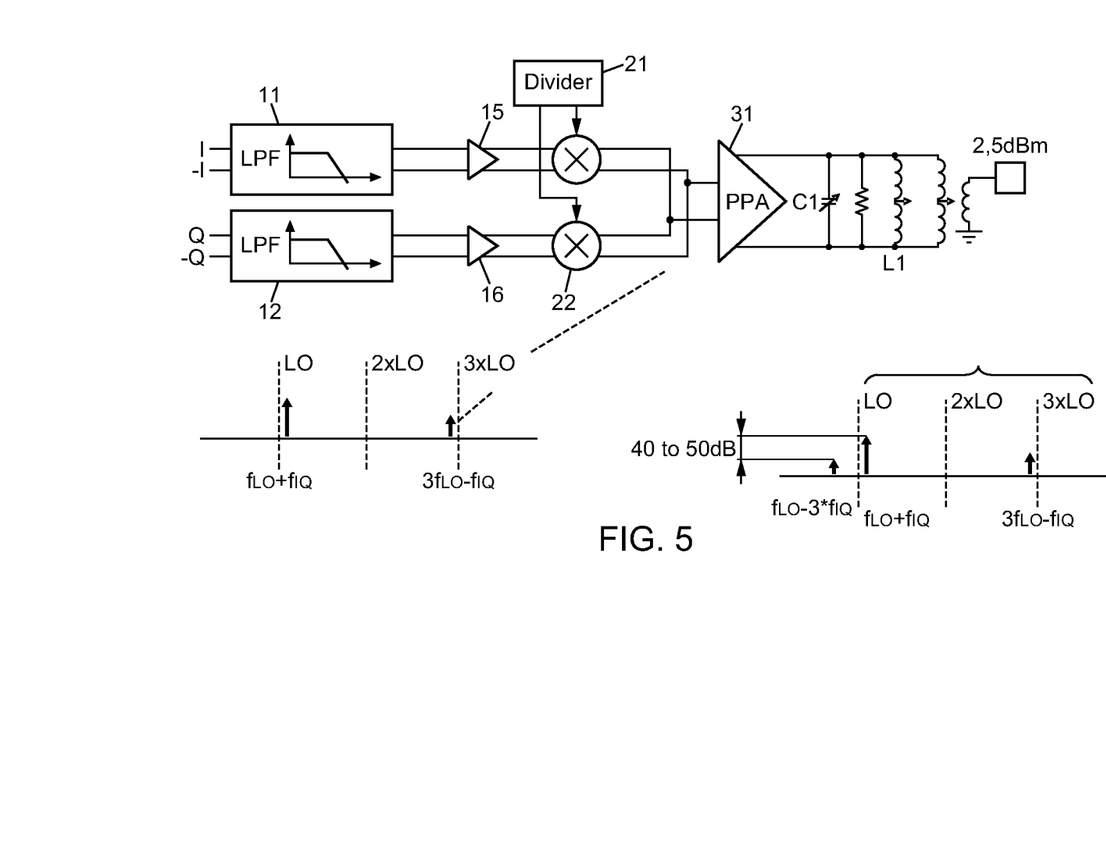
FIG. 5 is a block diagram indicating some components of a mixing device of the prior art.
Figure 6:
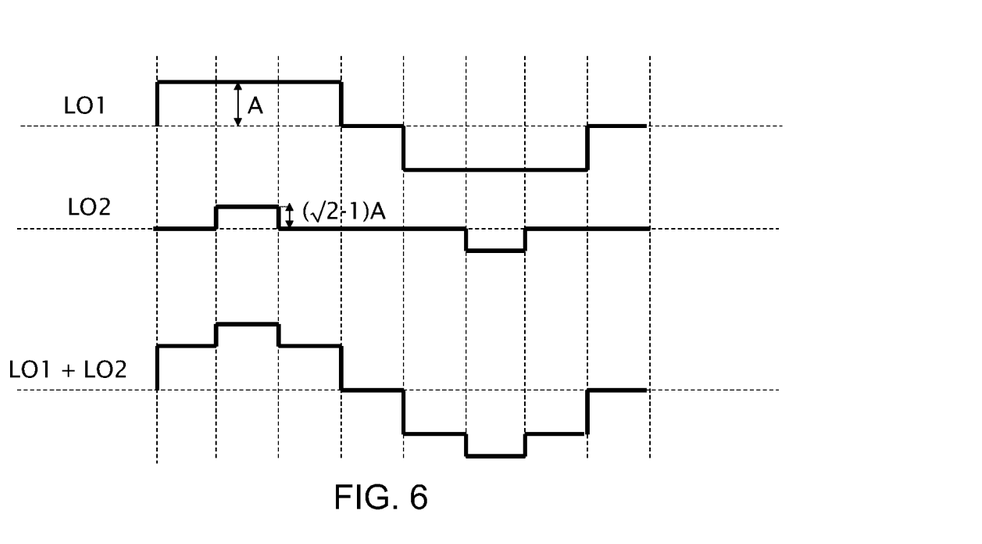
FIG. 6 is a graph illustrating LO signals for the N=8 embodiment disclosed herein.
Figure 7:
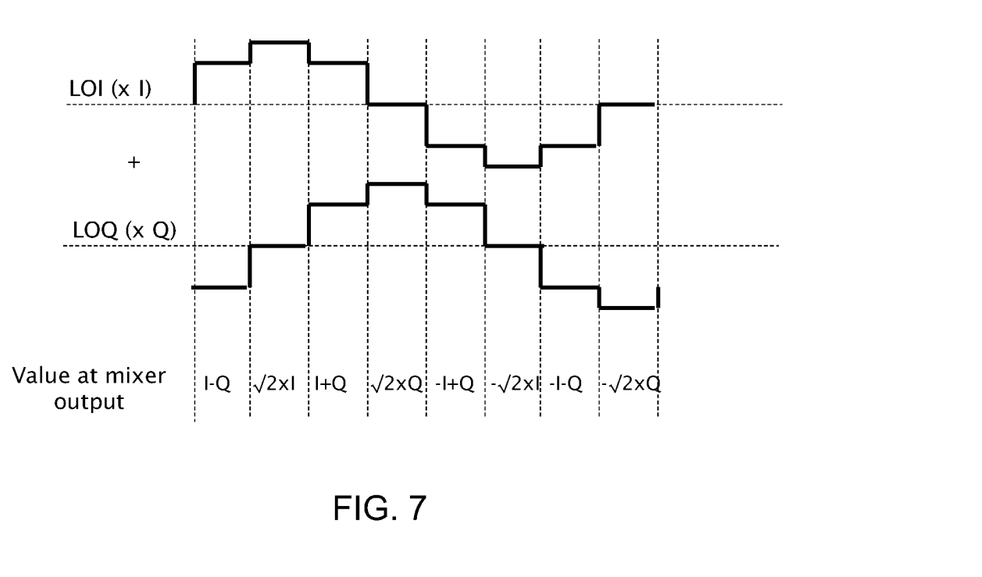
FIG. 7 is a graph illustrating the I and Q LO signals for the N=8 embodiment disclosed herein.

Some wireless systems use zero intermediate frequency architecture, referred to herein as zero-IF architecture in which a signal is up-converted in mixing circuitry, in a single step, directly from quadrature related in-phase (I) and quadrature (Q) signals at baseband frequencies. In some devices Low-IF technology is used in which an RF signal is mixed up from a non-zero low or moderate intermediate frequency, typically a few megahertz FIG. 4 is a block diagram of an exemplary zero-IF quadrature direct frequency up-converter of a transceiver. A quadrature baseband signal comprising two components BBI and BBQ is fed, from two IQ digital to analogue converters (DAC) (not shown) through first and second low pass filters 11, 12 in order to filter the DAC aliases. The outputs of the low pass filters 11, 12 are then fed via buffers 15 and 16 to first and second mixers 21, 22, respectively, where they are mixed with the two quadrature components LOI and LOQ of a quadrature local oscillator signal to up-convert the baseband signal. The buffers 15 and 16 each comprise an amplifier and have a low output impedance to provide current to a PPA when the mixers are switching. The Low pass filters 11, 12 have a high output impedance. The frequency of the local oscillator signal corresponds to the desired RF transmission frequency. The outputs of the two mixers 21, 22 are then fed to a pre-power amplifier (PPA) 31 to amplify the RF signal. The output of the amplifier 31 is fed to an inductor and an optional balun for differential to single ended conversion prior to being transmitted by an antenna. Graph (i) of FIG. 5 illustrates the tones generated at the input to the PPA 31. Tone $3f_{lo}$-$f_{lq}$, is the product of the harmonic mixing in the mixer. Typically the radio to desired signal is 10 dBc. Graph (ii) of FIG. 5 illustrates how the $3^{rd}$ order intermodulation $3f_{1O}$-$f_{IQ}$-$2*(f_{lo}+f_{IQ})$ creates parasitic tones $f_{lo}$-$3*f_{lq}$ In order to improve the linearity of the transceiver, the 3rd order intermodulation product of the 3× LO frequency at the mixer output with the desired signal should be reduced. A number of attempts have been made to improve the linearity of the PPA, to decrease the level of 3×LO at the PPA input In some approaches by playing with biasing, input level and transistors sizing, it is possible to improve the linearity of the PPA. However, for cellular applications, it can be very difficult to improve the linearity by 15 dB without having a strong impact on noise and power consumption.

Another proposed technique to improve linearity is by inserting intermediate filtering between the mixer and the PPA. This solution however has the drawback that there is a compromise between desired attenuation and 3×LO filtering. Moreover, this type of solution requires calibration during manufacture.

Instead of using a standard square wave at the LO side of the mixer, some approaches such as described in WO 2008/135954 employ specially generated LO waveforms. A composite signal with 3×LO and 5×LO harmonics cancellation is used in some approaches. An example of a composite signal is illustrated in FIG. 5 where a first LO signal LO1 and a second LO signal LO2 have equal and opposite $3^{rd}$ and $5^{th}$ order harmonics creating a composite signal LO1+LO2 which is free of $3^{rd}$ and $5^{th}$ harmonics. Some techniques apply this principle in current mode mixers. The main drawbacks of this procedure are that the noise/linearity compromise of such a current mode mixer requires a large biasing current, and the baseband current has to be switched off during some phases.

SUMMARY

To better address one or more of the foregoing concerns, a first aspect of the invention provides a frequency conversion device for transforming a frequency of an input signal, the device comprising: a baseband signal generator for providing a plurality N of first signals at a first frequency from an input signal having an in-phase component I and a quadrature signal component Q; an oscillator for generating N parallel oscillation signals, wherein the N oscillation signals are stepped in phase with respect to one another; a mixer comprising N mixing components, each mixing component being coupled to receive a respective one of the plurality of first signals and coupled to receive a respective oscillation signal for mixing the respective first signal with the corresponding oscillation signal to provide an output signal; and a common amplifier for receiving the N output signals from the N mixing components in N sequential phases for transmission.

In an embodiment of the invention each mixing component comprises a switching arrangement including a first switch controlled by the respective oscillator signal for controlling provision of the corresponding baseband signal to the common amplifier.

In an embodiment of the invention N is a multiple of 8; and the or each set of 8 first signals comprise the following signals I−Q √2×I; I+Q; √2×Q; −I+Q; −√2×I; −I−Q; and −√2×Q. In particular embodiments the 8 switching arrangements are operable to supply the first signals to the common amplifier in the following sequential or reversed sequential order I−Q √2×I; I+Q; √2×Q; −I+Q; −√2×I; −I−Q; and −2×Q.

In an embodiment of the invention N is a multiple of 6; and the or each set of 6 first signals comprise the following signals I−Q; 2×I+Q; I+2×Q; −I+Q; −2×I−Q; and −I−2×Q. In particular embodiments the 6 switching arrangements are operable to supply the first signals to the common amplifier in the following sequential or reversed sequential order I−Q; 2×I+Q; I+2×Q; −I+Q; −2×I−Q; and −I−2×Q.

In an embodiment each switching arrangement further comprises a second switch arranged in parallel to the first switch for receiving an opposing first signal to the first signal received at the first switch and controllable by the respective oscillation signal for provision of a differential output signal.

In embodiments the device includes N signal amplifiers, each amplifier being arranged to amplify a respective first signal.

In some embodiments the device is operable to transform the input signal from a first frequency to a second frequency higher than the first frequency and wherein the oscillation signals are at the second frequency. In an embodiment the duty cycle of each of the oscillation signals may be 12.5%

A further aspect of the invention provides a transmitter comprising a frequency conversion device as described above.

An even further aspect of the invention provides a method of frequency transformation comprising providing a plurality N of first signals at a first frequency from an input signal having an in-phase component I and a quadrature signal component Q; generating N parallel oscillation signals, wherein the N oscillation signals are stepped in phase with respect to one another; mixing each first signal with a respective oscillation signal to provide an output signal; an amplifying the N output signals from the N mixing components in N sequential phases for transmission.

At least parts of the methods according to the invention may be computer implemented. The methods may be implemented in software on a programmable apparatus. They may also be implemented solely in hardware or in software, or in a combination thereof.

Since embodiments of the present invention can be implemented in software, the present invention can be embodied as computer readable code for provision to a programmable apparatus on any suitable carrier medium. A tangible carrier medium may comprise a storage medium such as a floppy disk, a CD-ROM, a hard disk drive, a magnetic tape device or a solid state memory device and the like. A transient carrier medium may include a signal such as an electrical signal, an electronic signal, an optical signal, an acoustic signal, a magnetic signal or an electromagnetic signal, e.g. a microwave or RF signal.

BRIEF DESCRIPTION OF THE DRAWINGS

Embodiments of the invention will now be described, by way of example only, and with reference to the following drawings in which.

DETAILED DESCRIPTION

Figure 1A:
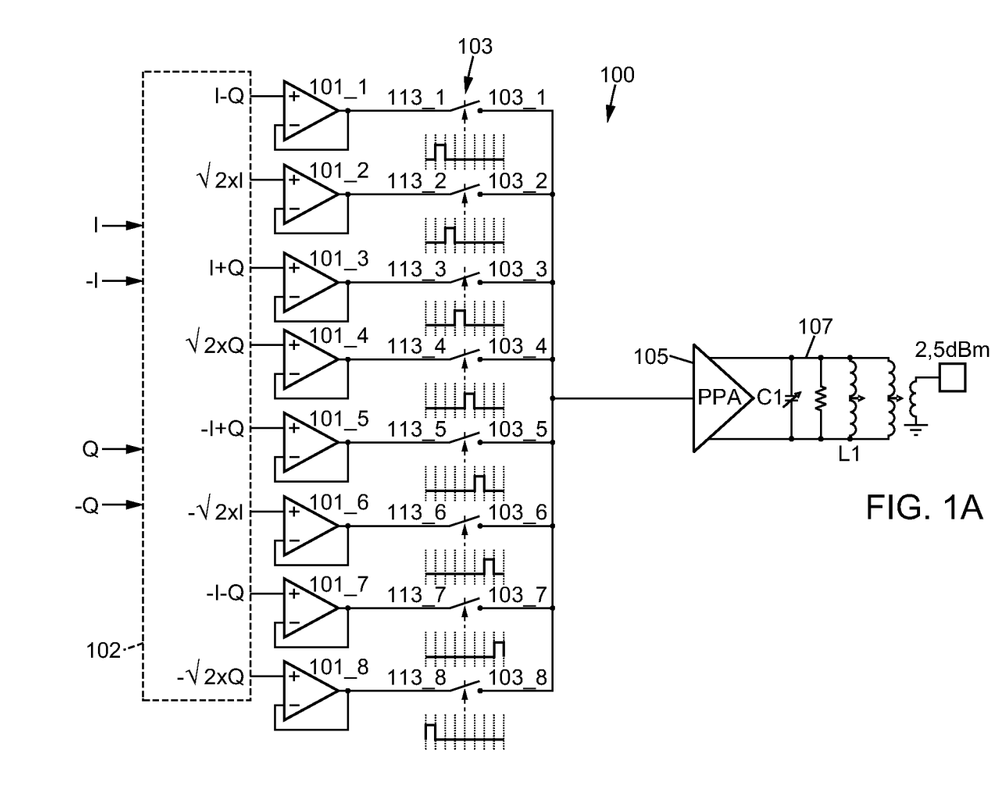
FIG. 1A is a block diagram of a mixing device according to a first embodiment of the invention.

FIG. 1A is a block diagram illustrating the components of a frequency conversion device 100 of a transmission device according to a first embodiment of the invention. The frequency conversion device according to the first embodiment is a voltage mode up-mixer device 100 using 8 phases and 8 respective sub-mixers to mix baseband composite signals.

Figure 1B:
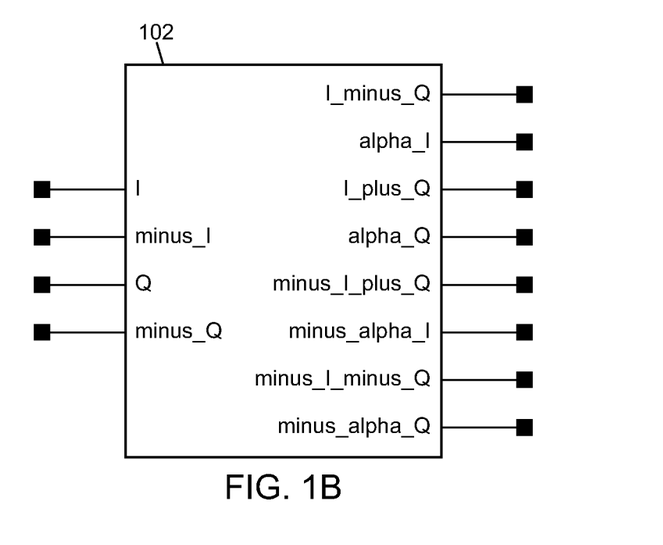
FIG. 1B is a block diagram of a signal generation module according to an embodiment of the invention.

The frequency conversion device 100 includes an analogue signal generation module 102 for generating a plurality N of first signals at a first frequency as illustrated in FIG. 1B. In some embodiments, the first frequency is a baseband frequency, and thus, the signal generation module 102 comprises an analogue baseband signal generation module 102. For simplicity, the following describes the signal generation module in terms of baseband frequencies. It will be appreciated, however, that the signal generation module 102 does not require the first frequency to be a baseband frequency.

Figure 1C:
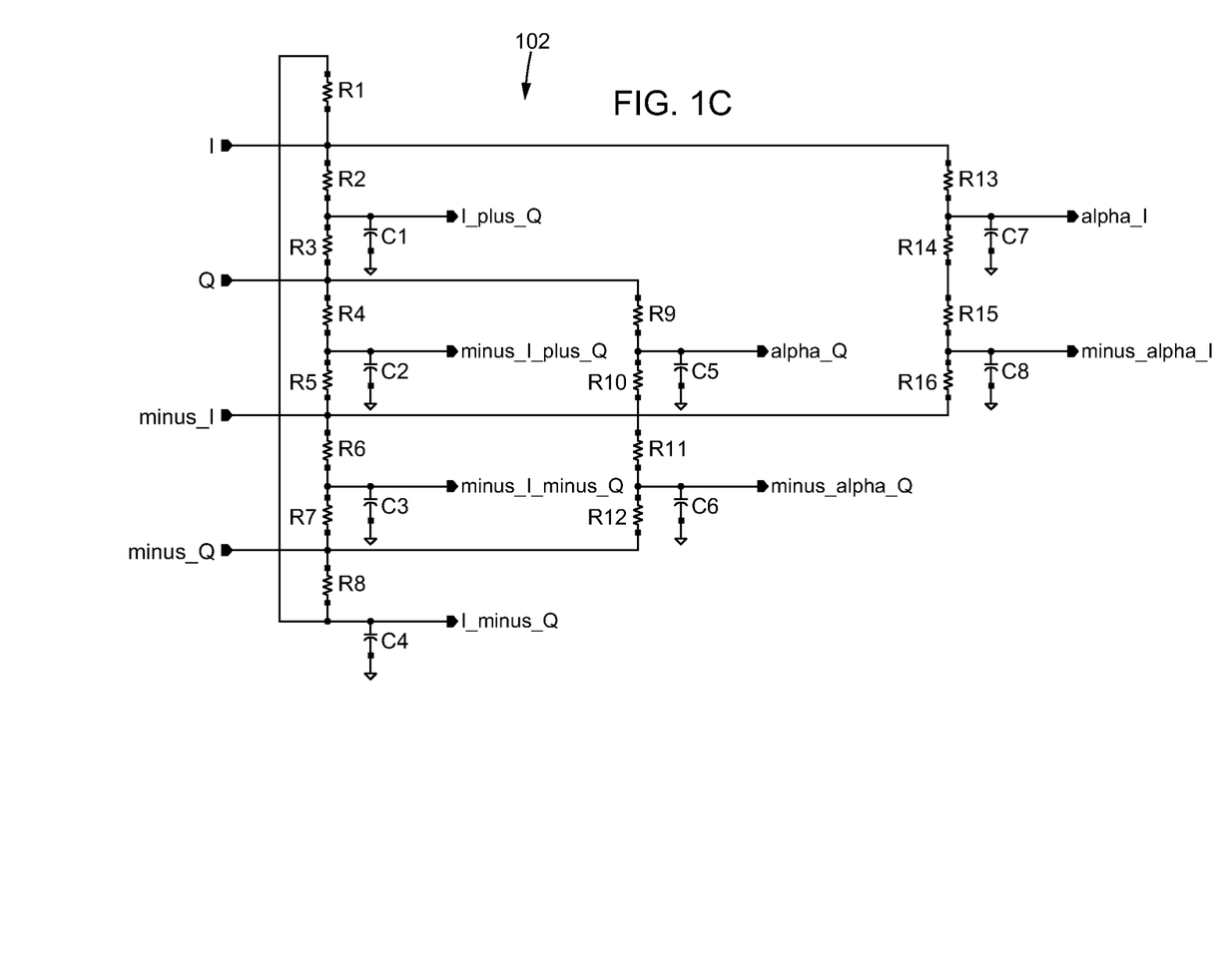
FIG. 1C is schematic diagram of the signal generation module of FIG. 1B.

The signal generation module 102 is configured to receive baseband IF signals comprising an in-phase (I) component and a quadrature (Q) component from modulation circuitry of the transmission signal processing chain. The analogue signal generation module includes weighting circuitry, for example resistor configurations as illustrated in FIG. 10 and composes, from the in-phase (I) component and a quadrature (Q) component, eight different respective I/O composite baseband signals in parallel as follows:

I−Q
√2×I
I+Q
√2×Q
−I+Q
−√2×I
−I−Q
−√2×Q

In FIGS. 1B and 1C √2 is referred to as alpha.

The voltage mode up mixer device 100 includes eight baseband amplifiers 101_1 to 101_8 for amplifying a respective I/O composite signal from the baseband signal generation module 102. Baseband amplifier 101_1 receives and amplifies composite signal I-Q, baseband amplifier 102_2 receives and amplifies signal √2×I, etc. . . .

The voltage mode up-mixer device 100 also includes a mixer device 103 for converting the frequencies of the composite baseband signals to RF frequencies. The mixer device 103 includes a set of eight mixer components 103_1 to 103_8 respectively comprising switches 113_1 to 113_8. Each switch 113_n is placed between the output of a respective baseband amplifier 101_n and the input to a common pre-Power Amplifier (PPA) 105. The PPA may be on-chip or off-chip. Closing of the switch 113_n connects the respective baseband amplifier 101_n to the PPA 105 so that the corresponding I/O composite signal mixed with a voltage oscillator signal is fed to the PPA 105.

The switches 113_1 to 113_8 are controlled by parallel voltage oscillator signals each having a frequency corresponding to the desired RF carrier frequency but being phased in time with respect to one another such that the first switches 113_1 to 113_8 are opened and closed in eight sequential steps. In this way the first oscillator signal closes switch 113_1, and then opens switch 113_1, then the second oscillator signal closes switch 113_2 and opens switch 113_2, then the third oscillator signal closes switch 113_3 and then opens it, followed by operation of switch 113_4 by the fourth oscillation signal and so on. In this way the eight different I/O composite signals at the desired RF frequency can be fed in turn during eight sequential phases to the PPA 105.

The oscillator signals used for this voltage mixing operation are basic square waves with an adequate duty cycle to enable each of the eight switches 113_1 to 113_8 to be opened and closed sequentially during one cycle, for example a duty cycle of 12.5%.

Figure 2:
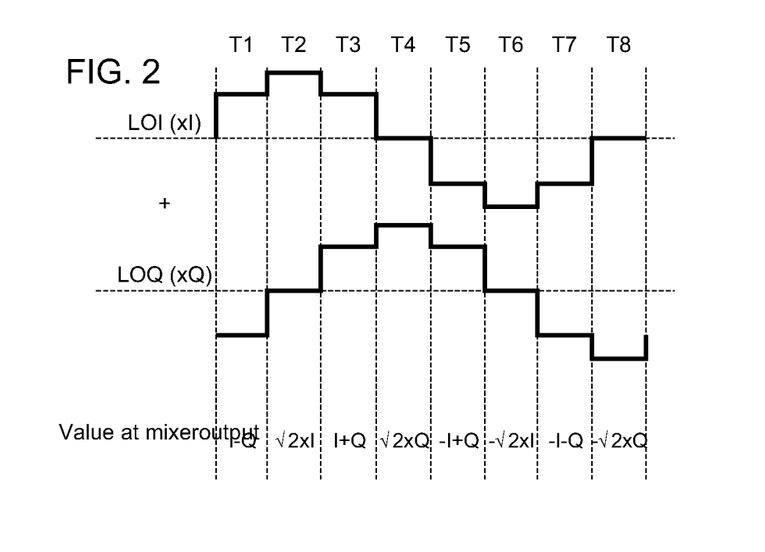
FIG. 2 is a graph illustrating mixed signals generated by embodiments of the invention.

As illustrated in FIG. 2, eight time steps are thus defined using switches 113_1 to 113_8 to generate in turn, each of the eight different mixed base band signal values I−Q, √2×I, I+Q, √2×Q, −I+Q, −√2×I, −I−Q and −√2×Q in eight sequential phases T1 to T8.

It will be appreciated that the switches may be opened and closed in reverse sequential order starting with switch 113_8 to switch 113_1 to produce the mixed signal values in reversed sequential order −√2×Q, −I−Q, −√2×I, −I+Q, √2×Q, I+Q, √2×I and I−Q in sequential phases T1 to T8.

The device 100 further includes BALUN circuitry 107 for processing the signal from the PPA 105 prior to transmission. The resulting RF signal is then fed to a transmission antenna (not shown) for transmission.

Figure 3:
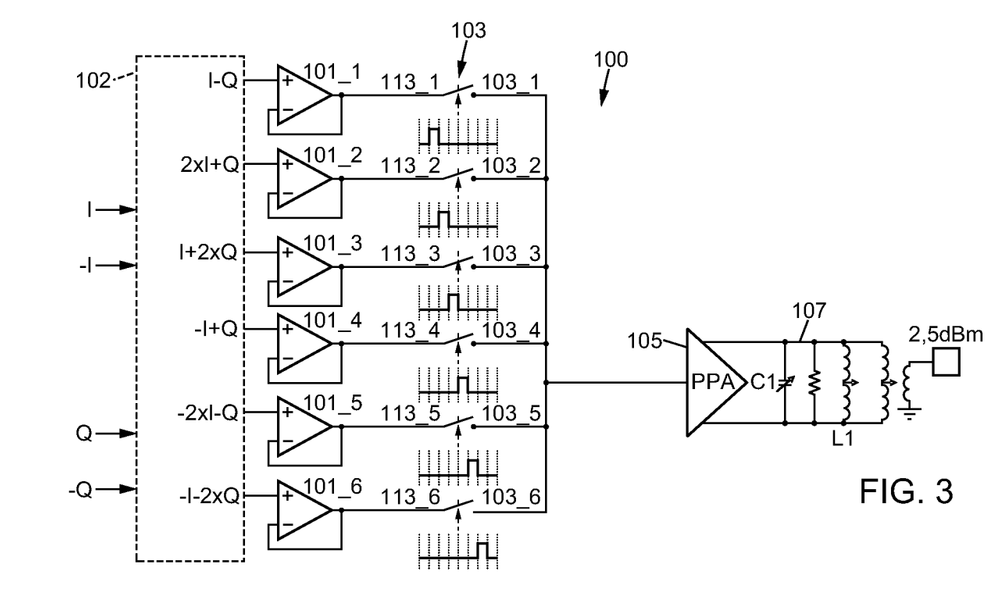
FIG. 3 is a block diagram of a mixing device according to another embodiment of the invention.

Although this embodiment of the invention has been described as having eight composite IQ signals and eight phases, it will be appreciated that in general embodiments of the invention, N baseband composite signals can be generated and mixed with an N-phase mixer where N>1. In particular N can be a multiple of 8. The N baseband signals comprise a set of the 8 following signals: I−Q, √2×I, I+Q, √2×Q, −I+Q, −√2×I, −I−Q, and −√2×Q. When N equals 16 for instance, N baseband signals comprise further include a set of 8 additional signals spaced in between the above 8 signals. In another example, N equals 6 or may comprise a multiple of 6, where the N baseband signals comprise a set of the 6 following signals: I−Q; 2×I+Q; I+2×Q; −I+Q; −2×I−Q; and −I−2×Q, as shown in FIG. 3. In this example, six time steps are defined using six switches, e.g., 113_1 to 113_6, to generate in turn, each of the six different mixed base band signal values I−Q; 2×I+Q; I+2×Q; −I+Q; −2×I−Q; and −I−2×Q in six sequential phases T1 to T6. It will be appreciated that other values of N>1 are also applicable to the invention disclosed herein. Further, while the exemplary embodiments discussed herein have been described in terms of upconverting N baseband signals, it will be appreciated that the invention disclosed herein may be used to upconvert a signal at any frequency.

In a further embodiment of the invention as illustrated in FIG. 4, the voltage up-mixer device 200 may comprise double switches 203_n in order to create a differential signal at the output of the mixer device 203. The up mixer device 200 of the second embodiment of the invention is similar to the first embodiment wherein like references relate to like elements. However, each mixing component 203_1 to 203_8 comprises two parallel switches for each composite baseband line (213_1 and 223_1) to (213_8 to 223_8). The further switches 223_1 to 223_8 are connected to the opposing composite baseband signal opposing the baseband signal connected to the respective switches 213_1 to 213_8. For example, in the first mixing component 103_1 in which switch 113_1 is connected to composite baseband signal I−Q, switch 123_1 is connected to composite baseband signal I+Q. In the second mixing component 103_2 in which switch 113_2 is connected to composite baseband signal √2×I, switch 123_2 is connected to composite baseband signal −√2×I, and so on.

Figure 8:
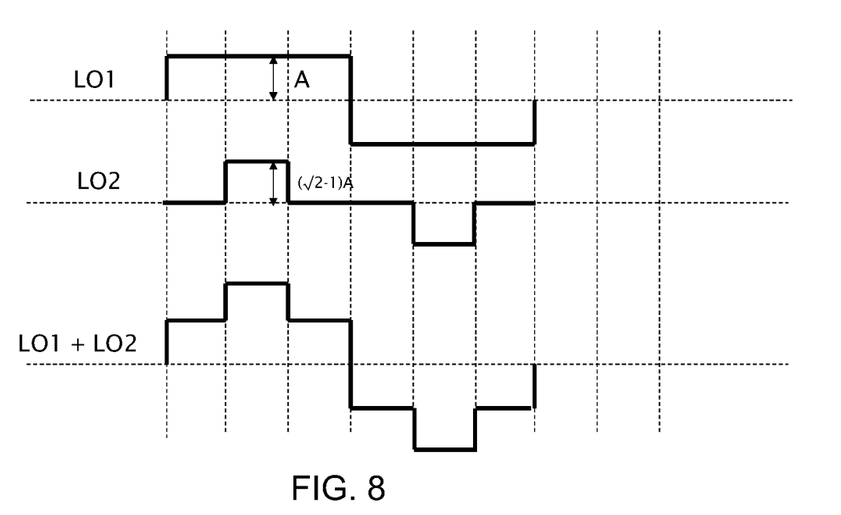
FIG. 8 is a graph illustrating LO signals for the N=6 embodiment disclosed herein.
Figure 9:
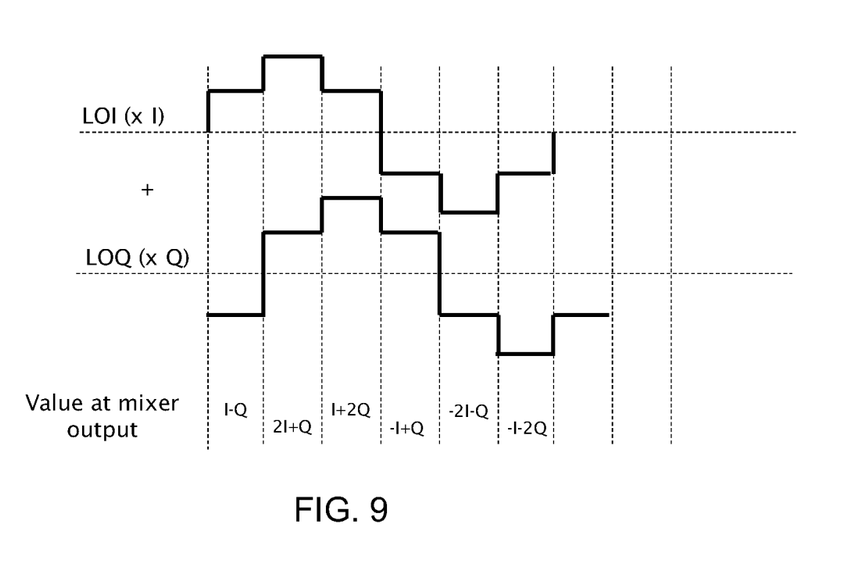
FIG. 9 is a graph illustrating the I and Q LO signals for the N=6 embodiment disclosed herein.

Embodiments of the invention enable low levels of $3^{rd}$ harmonics 3×LO−IQ and fifth harmonics 5×LO+IQ to be generated at the mixer output which relaxes the PPA linearity requirement, as demonstrated by FIGS. 6-9. In particular, FIG. 6 demonstrates the process of building an LO signal free of $3^{rd}$ order and $5^{th}$ order harmonics for N=8, and FIG. 7 extends this concept to an IQ mixer. FIG. 8 demonstrates the process of building an LO signal free of $3^{rd}$ order harmonics for N=6, and FIG. 9 extends this concept to an IQ mixer. In addition, a low level of out of band noise and power consumption can be reached with this type of voltage mixing, compared to current mode mixing. Moreover a simple square wave LO signal may be used in place of specially configured LO signals to achieve the desired harmonic suppression effects in a more simplified manner.

The mixing devices of the various embodiments of the invention may be incorporated into transmitting devices such as but not limited to mobile data communication devices including, for example, mobile telephones, smartphones and the like or in television transmission devices etc or any such device where a frequency up conversion with suppressed harmonics is required. Embodiments of the invention can be applied in low-IF or zero-IF systems for example.

Although the present invention has been described hereinabove with reference to specific embodiments, the present invention is not limited to the specific embodiments. Many further modifications and variations will suggest themselves to those versed in the art upon making reference to the foregoing illustrative embodiments, which are given by way of example only and which are not intended to limit the scope of the invention, that being determined solely by the appended claims. In particular the different features from different embodiments may be interchanged, where appropriate.

In the claims, the word "comprising" does not exclude other elements or steps, and the indefinite article "a" or "an" does not exclude a plurality. The mere fact that different features are recited in mutually different dependent claims does not indicate that a combination of these features cannot be advantageously used. Any reference signs in the claims should not be construed as limiting the scope of the invention.

The invention claimed is:
1. A frequency conversion device for transforming a frequency of an input signal, the device comprising:
a signal generator for providing a plurality N of first signals at a first frequency from an input signal having an in-phase component I and a quadrature signal component Q;

an oscillator for generating N parallel oscillation signals, wherein the N oscillation signals are stepped in phase with respect to one another;

a mixer comprising N mixing components, each mixing component being coupled to receive a respective one of the plurality of first signals and coupled to receive a respective oscillation signal for mixing the respective first signal with the corresponding oscillation signal to provide an output signal; and a common amplifier for receiving the N output signals from the N mixing components in N sequential phases for transmission.

2. The device according to claim 1 wherein each mixing component comprises a switching arrangement including a first switch controlled by the respective oscillator signal for controlling provision of the corresponding first signal to the common amplifier.

3. The device according to claim 2, wherein N is a multiple of 8; and the N first signals comprise a set of 8 signals comprising I−Q; √2×I; I+Q; √2×Q; −I+Q; −√2×I; −I−Q; and −√2×Q signals.

4. The device according to claim 3 wherein the switching arrangements are operable to supply the first signals to the common amplifier in the following sequential or reversed sequential order: I−Q; √2×I; I+Q; √2×Q; −I+Q; −√2×I; −I−Q; and −√2×Q.

5. The device according to claim 2, wherein N is a multiple of 6; and the N first signals comprise a set of 6 signals comprising I−Q; 2×I+Q; I+2×Q; −I+Q; −2×I−Q; and −I−2×Q signals.

6. The device according to claim 5 wherein the switching arrangements are operable to supply the first signals to the common amplifier in the following sequential or reversed sequential order: I−Q; 2×I+Q; I+2×Q; −I+Q; −2×I−Q; and −I−2×Q.

7. The device according to claim 2 wherein each switching arrangement further comprises a second switch arranged in parallel to the first switch for receiving an opposing first signal to the first signal received at the first switch and controllable by the respective oscillation signal for provision of a differential output signal.

8. The device according to claim 1, further comprising N signal amplifiers, each amplifier being arranged to amplify a respective first signal.

9. The device according to claim 1 wherein the device is operable to transform the input signal from the first frequency to a second frequency higher than the first frequency and wherein the oscillation signals are at the second frequency.

10. The device according to claim 1 wherein N equals 8 and the duty cycle of each of the oscillation signals is 12.5%.

11. The device according to claim 1 wherein N equals 6 and the duty cycle of each of the oscillation signals is 16.67%.

12. The device according to claim 1 wherein the first frequency comprises a baseband frequency.

13. The device according to claim 1 wherein N comprises an even number.

14. A method of frequency transformation comprising
providing a plurality N of first signals at a first frequency from an input signal having an in-phase component I and a quadrature signal component Q;

generating N parallel oscillation signals, wherein the N oscillation signals are stepped in phase with respect to one another;

mixing each first signal with a respective oscillation signal to provide an output signal; and amplifying the N output signals from the N mixing components in N sequential phases for transmission.

15. The method according to claim 14 wherein mixing each first signal with a respective oscillation signal comprises controlling a switching arrangement receiving one of the first signals by the respective oscillator signal to provide the corresponding first signal to the common amplifier.

16. The method according to claim 15, wherein N is a multiple of 8; and the N first signals comprise a set of 8 signals comprising I−Q; √2×I; I+Q; √2×Q; −I+Q; −√2×I; −I−Q; and −√2×Q signals.

17. The method according to claim 16 wherein the switching arrangements are operable to supply the first signals to the common amplifier in the following sequential or reversed sequential order: I−Q; √2×I; I+Q; √2×Q; −I+Q; −√2×I; −I−Q; and −√2×Q.

18. The method according to claim 15, wherein N is a multiple of 6; and the N first signals comprise a set of 6 signals comprising I−Q; 2×I+Q; I+2×Q; −I+Q; −2×I−Q; and −I−2×Q signals.

19. The method according to claim 18 wherein the switching arrangements are operable to supply the first signals to the common amplifier in the following sequential or reversed sequential order: I−Q; 2×I+Q; I+2×Q; −I+Q; −2×I−Q; and −I−2×Q.

20. The method according to claim 14 wherein the first frequency comprises a baseband frequency.

21. The method according to claim 14 wherein N comprises an even number.

22. A computer program product stored in a non-transitory computer readable medium for controlling a data-processing device, the computer program product comprising a set of instructions which, when loaded into the data-processing device, causes the device to:

provide a plurality N of first signals at a first frequency from an input signal having an in-phase component I and a quadrature signal component Q;

generate N parallel oscillation signals, wherein the N oscillation signals are stepped in phase with respect to one another;

mix each first signal with a respective oscillation signal to provide an output signal; and amplify the N output signals from the N mixing components in N sequential phases for transmission.

23. A transmitter comprising a frequency conversion device for transforming a frequency of an input signal, the frequency conversion device comprising:

a signal generator for providing a plurality N of first signals at a first frequency from an input signal having an in-phase component I and a quadrature signal component Q;

an oscillator for generating N parallel oscillation signals, wherein the N oscillation signals are stepped in phase with respect to one another;

a mixer comprising N mixing components, each mixing component being coupled to receive a respective one of the plurality of first signals and coupled to receive a respective oscillation signal for mixing the respective first signal with the corresponding oscillation signal to provide an output signal; and a common amplifier for receiving the N output signals from the N mixing components in N sequential phases for transmission.

* * * * *